(12) United States Patent
Saxena

(10) Patent No.: US 9,781,519 B2
(45) Date of Patent: Oct. 3, 2017

(54) MOLDED INTERCONNECT MIRCOELECTROMECHANICAL SYSTEM (MEMS) DEVICE PACKAGE

(71) Applicants: Akustica, Inc., Pittsburgh, PA (US); Robert Bosch GmbH, Stuttgart (DE)

(72) Inventor: Kuldeep Saxena, Sewickley, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/099,096

(22) Filed: Apr. 14, 2016

(65) Prior Publication Data

US 2016/0234604 A1 Aug. 11, 2016

Related U.S. Application Data

(63) Continuation-in-part of application No. 14/924,789, filed on Oct. 28, 2015, now Pat. No. 9,661,421.

(60) Provisional application No. 62/069,939, filed on Oct. 29, 2014.

(51) Int. Cl.

| | |
|---|---|
| *H04R 19/04* | (2006.01) |
| *B81B 7/00* | (2006.01) |
| *H04R 19/00* | (2006.01) |
| *H04R 1/06* | (2006.01) |
| *H04R 1/04* | (2006.01) |

(52) U.S. Cl.
CPC ............ *H04R 19/04* (2013.01); *B81B 7/0041* (2013.01); *H04R 1/04* (2013.01); *H04R 1/06* (2013.01); *H04R 19/005* (2013.01); *B81B 2201/0257* (2013.01); *B81B 2207/097* (2013.01); *B81C 2203/0118* (2013.01); *H04R 2201/003* (2013.01)

(58) Field of Classification Search
CPC ........ H04R 19/005; H04R 1/06; H04R 19/04; H04R 2201/0257; H04R 2201/003; H04R 2231/001; B81C 2203/0118
See application file for complete search history.

(56) References Cited

U.S. PATENT DOCUMENTS

| | | | |
|---|---|---|---|
| 8,447,057 | B2 | 5/2013 | Goida et al. |
| 8,842,858 | B2 | 9/2014 | Lillelund |
| 8,842,859 | B2 | 9/2014 | Delaus et al. |
| 2008/0175425 | A1 | 7/2008 | Roberts et al. |
| 2009/0175479 | A1 | 7/2009 | Shirasaka |
| 2009/0243060 | A1 | 10/2009 | Saitoch |
| 2010/0155863 | A1 | 6/2010 | Weekamp |

(Continued)

FOREIGN PATENT DOCUMENTS

| | | |
|---|---|---|
| JP | 2013074151 A | 4/2013 |
| WO | 2012143151 A1 | 10/2012 |

(Continued)

*Primary Examiner* — Fernando L Toledo
*Assistant Examiner* — Neil Prasad
(74) *Attorney, Agent, or Firm* — Maginot Moore & Beck LLP

(57) ABSTRACT

A microelectromechanical system (MEMS) device package for encapsulating a MEMS device a molded package spacer that connects to a conductive lid and to a substrate. The molded package spacer forms either side walls or a divider of the MEMS device package and is adapted to route electrical connections from the MEMS device to either the substrate or a second MEMS device package via the substrate.

18 Claims, 16 Drawing Sheets

(56) References Cited

U.S. PATENT DOCUMENTS

| | | | |
|---|---|---|---|
| 2012/0087521 A1* | 4/2012 | Delaus | B81C 1/00238 |
| | | | 381/174 |
| 2013/0050227 A1* | 2/2013 | Petersen | H01L 23/053 |
| | | | 345/501 |
| 2013/0343590 A1 | 12/2013 | Nakagawa et al. | |
| 2014/0205127 A1 | 7/2014 | Khenkin et al. | |
| 2014/0254835 A1 | 9/2014 | Yakura | |
| 2014/0264654 A1 | 9/2014 | Salmon | |
| 2016/0234604 A1* | 8/2016 | Saxena | H04R 19/04 |

FOREIGN PATENT DOCUMENTS

| | | | | |
|---|---|---|---|---|
| WO | 2014040017 A1 | 3/2014 | | |
| WO | WO 2014160006 A3 * | 1/2015 | | H04R 19/04 |

* cited by examiner

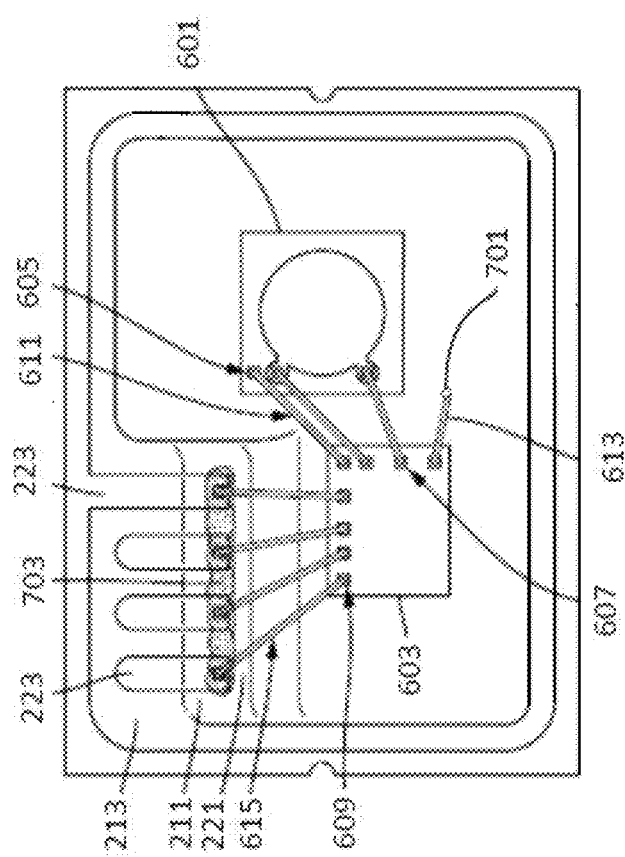

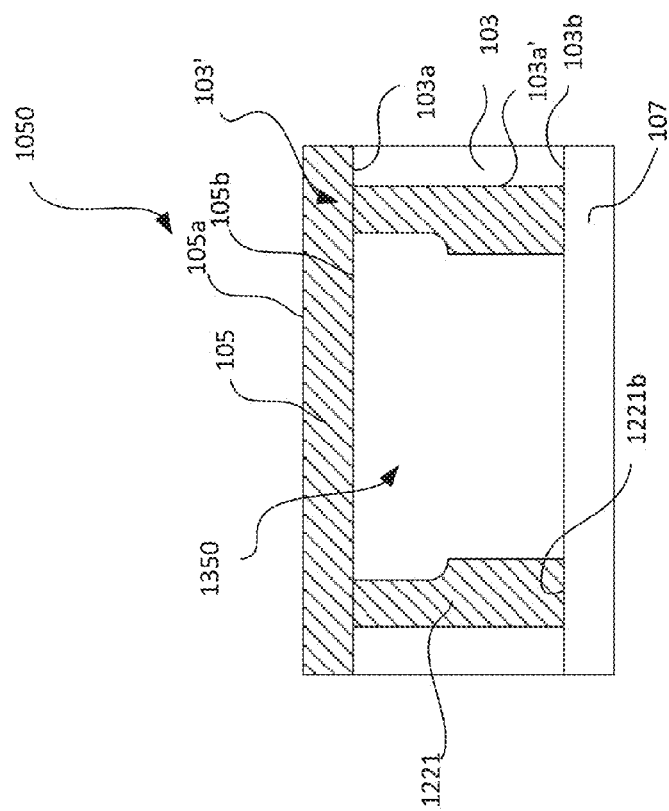
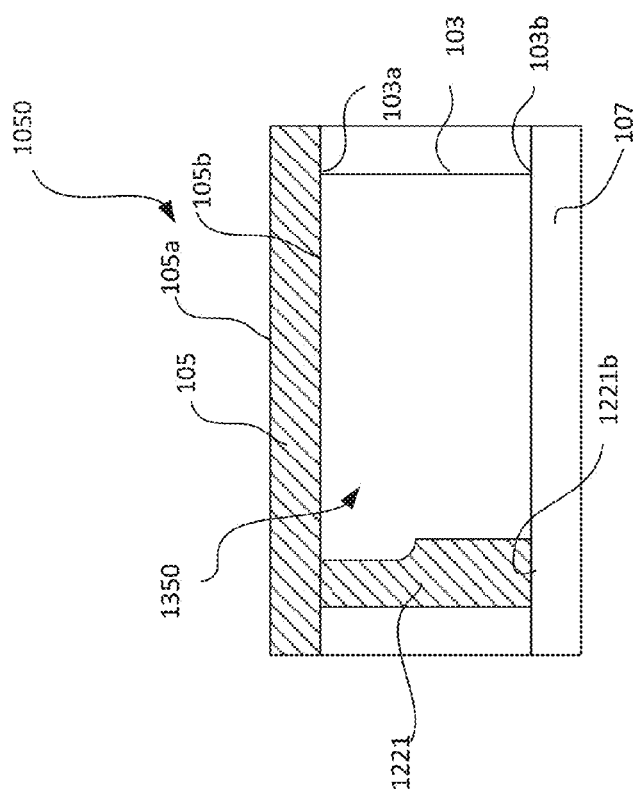

US 9,781,519 B2

MOLDED INTERCONNECT MIRCOELECTROMECHANICAL SYSTEM (MEMS) DEVICE PACKAGE

CROSS-REFERENCE TO RELATED CASES

This application is a continuation-in-part of U.S. Utility patent application Ser. No. 14/924,789 filed Oct. 28, 2015, which claims the benefit of U.S. Provisional Patent Application No. 62/069,939 filed on Oct. 29, 2014. All of these related applications are incorporated herein by reference.

BACKGROUND

The disclosure relates to Microelectromechanical System (MEMS) packages, and more particularly, to a MEMS device package.

SUMMARY

A microelectromechanical system (MEMS) device package includes a substrate, a conductive lid, and a package spacer positioned between and connects the conductive lid and the substrate. The package spacer is formed from a molded material, such as plastic or ceramic, and may have a conductive lining on a bottom and/or top surface of the package spacer. The package spacer provides a pathway for electronic communication with the interior of the MEMS device package. The conductive lid may be constructed of a metal plate, which electrically connects to the package spacer. The metal plate provides for a low-cost material to enclose the acoustic cavity. Additionally, the metal plate provides protection to interior components of the device package and helps to create a durable, dent-resistant MEMS device package.

In one embodiment, the disclosure provides a microelectromechanical system (MEMS) device package that includes a MEMS die and an application specific integrated circuit (ASIC) electrically connected to the MEMS die. The ASIC is configured to receive the electrical signal from the MEMS die. The MEMS device package also includes a substrate with electrical connection pads, a conductive lid, and a package spacer. The package spacer has a top surface and a bottom surface. The top surface is connected to the conductive lid and the bottom surface is connected to the substrate. The package spacer is formed of a molded material.

In another embodiment, a MEMS device package comprises a package spacer having a cavity and a bonding self, a MEMS die, and an ASIC. The bonding self integrally formed as a portion of an interior of the package spacer. The MEMS and the ASIC disposed within the cavity are encapsulated by a conductive lid and a substrate. A surface formed on the bonding self contacts at least a portion of the substrate. The ASIC is electrically connected to the surface of the bonding self. The package spacer further comprises a first surface and a second surface. The first surface positioned above the surface formed on the bonding self is connected to the substrate. The second surface opposed to the first surface is connected to the conductive lid.

In yet another embodiment, a combo MEMS device package assembly comprises a first MEMS device package and a second MEMS device package coupled to the first MEMS device package in a back-to-back configuration via a common substrate. At least one port is formed on a first MEMS device package and the port is fluidly coupled to an external embodiment directly or indirectly via a second port formed on the second MEMS device package.

Other aspects of the disclosure will become apparent by consideration of the detailed description and accompanying drawings.

BRIEF DESCRIPTION OF THE DRAWINGS

FIG. 7 is a bottom view of the MEMS microphone package of FIG. 6.

FIGS. 11A-11D are cross-sectional views of another described embodiment of a MEMS device package.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Figure 1:
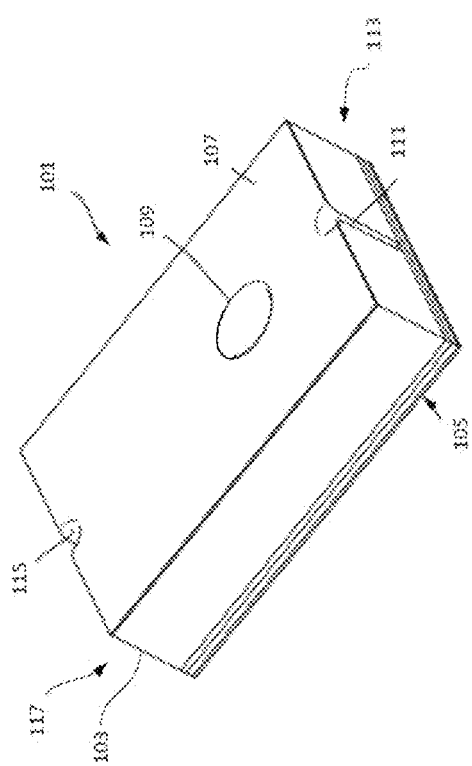
FIG. 1 is a perspective view of a MEMS microphone package according to one embodiment.

A perspective view of a MEMS microphone package 101 according to one embodiment is illustrated in FIG. 1. The MEMS microphone package 101 includes a package spacer 103, a substrate 105, and a conductive lid 107. The package spacer 103 forms side walls of the MEMS microphone package 101 and maintains a spacing between the substrate 105 and the conductive lid 107. The substrate 105 and the conductive lid 107 are fixed to the package spacer 103 during manufacturing of the MEMS microphone package 101. In one example, solder or epoxy may be used as a binding agent to hold the package spacer 103, the substrate 105, and the conductive lid 107 together. In this way, the package spacer 103, the substrate 105, and the conductive lid 107 protect internal electronics within the MEMS microphone package 101. For added strength, the conductive lid 107 may be formed of stamped metal. In addition, the conductive lid 107 may be substantially planar and parallel with the substrate 105. Included in the conductive lid 107 is an acoustic input port 109. The acoustic input port 109 is an aperture that allows acoustic pressure to enter the MEMS microphone package 101. The acoustic input port 109 may be formed on any location of the conductive lid 107. In one embodiment, the acoustic input port 109 may be located above internal electronics, i.e. microphone die, ASIC, or any electronic components. In another embodiment, the acoustic input port 109 may be located at a distance offset from the internal components. In yet another embodiment, the acoustic input port 109 may be located in proximal or adjacent to at least one of a corner of the conductive 107 without hindering the entrance of the acoustic pressure into the MEMS microphone package 101. Except for the acoustic input port 109, the MEMS microphone package 101 is sealed to form an airtight enclosure.

A conductive via 111 is positioned on a side 113 of the MEMS microphone package 101. The conductive via 111 is formed by etching, drilling, punching, or molding into the one side 113 of the package spacer 103. A conductive material (e.g., a metal coating) is deposited or otherwise formed within the conductive via 111. Alternatively, the conductive via 111 may be filled with metal. The conductive via 111 extends from the conductive lid 107 to the substrate 105. As a consequence, the conductive lid 107 is electrically connected to at least a portion of the substrate 105 by the conductive via 111. In the illustrated embodiment, a second conductive via 115 is positioned on a second side 117 of the MEMS microphone package 101. The second conductive via 115 is in most respects identical to the conductive via 111. More or less than two conductive via may be formed on the MEMS microphone package 101, depending on the application. The location of the conductive via may be formed on sides adjacent to the sides 113, 117 of the MEMS microphone package 101.

Figure 2:
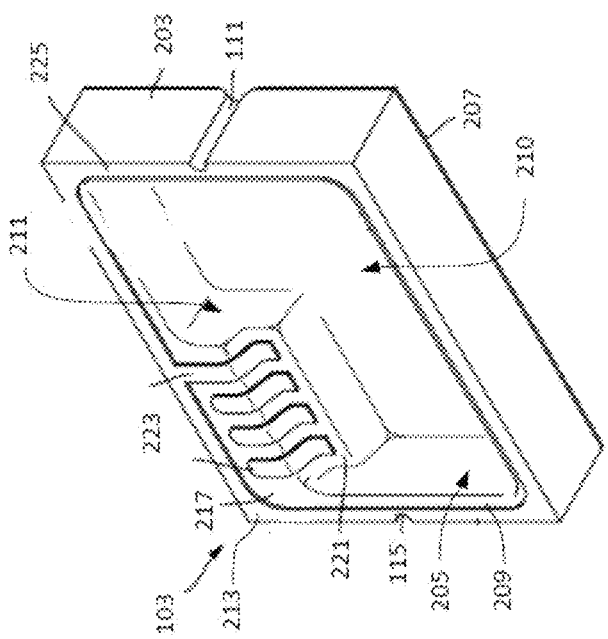
FIG. 2 is a perspective view of a package spacer of the MEMS microphone package of FIG. 1.

In FIG. 2, a perspective view of the package spacer 103 is illustrated prior to attachment of the substrate 105 and the conductive lid 107. In some embodiments, the package spacer 103 is formed by a molding process. For example, the package spacer 103 may be formed entirely of a plastic or polymer material. In other embodiments, the package spacer 103 is formed of ceramic or other non-conductive material. As a consequence, the package spacer 103 may be more rugged, less costly, and/or easier to manufacture than a MEMS microphone package 101 that is formed mostly from silicon, such as one formed from a silicon wafer. The package spacer 103 is formed such that it includes an exterior surface 203, an interior surface 205, a top surface 207, a bottom surface 209, and a cavity 210. The top surface 207 and/or the bottom surface 209 may be partially or completely coated with a conductive layer, such as, for example, a metalized film. In another embodiment, a metalized film or seed metalized layer may be formed within the package spacer 103.

In some embodiments, the package spacer 103 includes a bonding shelf 211. The bonding shelf 211 may form part of the interior surface 205 of the package spacer 103. In the illustrated embodiment, the bonding shelf 211 is positioned in a corner 213 of the package spacer 103. The bonding shelf 211 may be formed as a single monolithic component with the package spacer 103. For example, the bonding shelf 211 may be molded together with the package spacer 103 during manufacturing. Conversely, the bonding shelf 211 may be formed separately and fixed to the package spacer 103 after the molding process. The bonding shelf 211 includes a bottom surface 217 that may be flush with the bottom surface 209 of the package spacer 103. The bottom surface 217 and the bottom surface 209 may contact at least a portion of the substrate 105 when the substrate 105 is fixed to the package spacer 103. Alternatively, one of the surface 217, 209 may contact at least a portion of the substrate 105 when the substrate 105 is fixed to the package spacer 103. The bonding shelf 211 also includes a wire bonding surface 221. The wire bonding surface 221 provides a location for electrical connections within the MEMS microphone package 101. The bonding shelf 211 may form an S-curve that extends from the bottom surface 217 to the wire bonding surface 221. The wire bonding surface 221 may be parallel to the bottom surface 217. Depending on the application, more than one bonding shelf may be formed in the package spacer 103.

The bonding shelf 211 also includes conductive traces 223 that extend from the bottom surface 217 of the bonding shelf 211 to the wire bonding surface 221. The conductive traces 223 may be formed by depositing a conductive material, such as, for example, a metal film, onto the bonding shelf 211. The conductive traces 223, at one end, are electrically connected to a portion of the substrate 105 and, at the other end, terminate at the wire bonding surface 221. As a consequence, the conductive traces 223 provide electrical pathways between the interior of the MEMS microphone package 101 and the substrate 105. For example, the conductive traces 223 provide one or more ground lines, power lines, and signal lines that allow power and ground voltages to be supplied from the substrate 105 and allow signals to be carried to the substrate 105. Therefore, the package spacer 103 provides for electrical connections between the substrate 105 and the internal components of the MEMS microphone package 101. The package spacer 103 also may include a seal ring 225 that extends around a perimeter of the top surface 207 of the package spacer 103.

Figure 3:
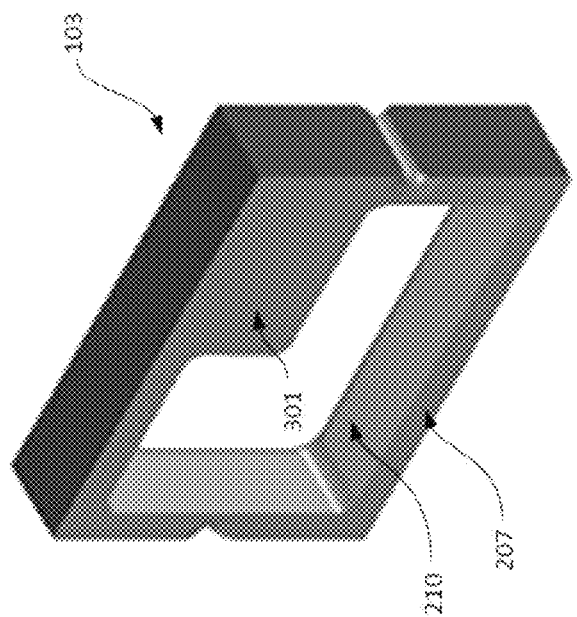
FIG. 3 is an opposite-side perspective view of the package spacer of FIG. 2.

In the embodiment illustrated in FIG. 3, the package spacer 103 includes a top surface 207. The top surface 207 may be flush with a top surface 301 of the bonding shelf 211. The top surface 207 contacts the conductive lid 107 when the conductive lid 107 is fixed to the package spacer 103 thereby providing electrical conductivity between the conductive lid 107, the conductive via 111, and the conductive via 115. The conductive lid 107 may also electrically connect to the interior surface 205 or the exterior surface 203 of the package spacer 103. As a consequence, the conductive lid 107, the conductive via 111, and the conductive via 115 form an electromagnetic shield for the internal components in the MEMS microphone package 101.

Figure 4:
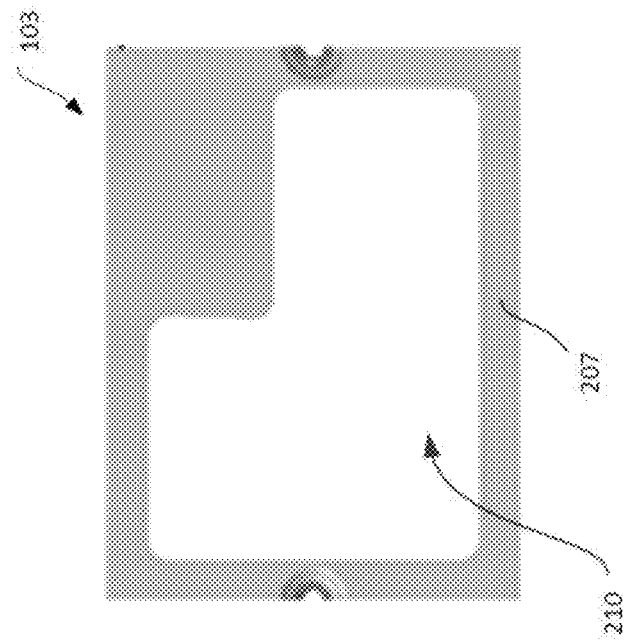
FIG. 4 is a bottom view of the package spacer of FIG. 2.
Figure 5:
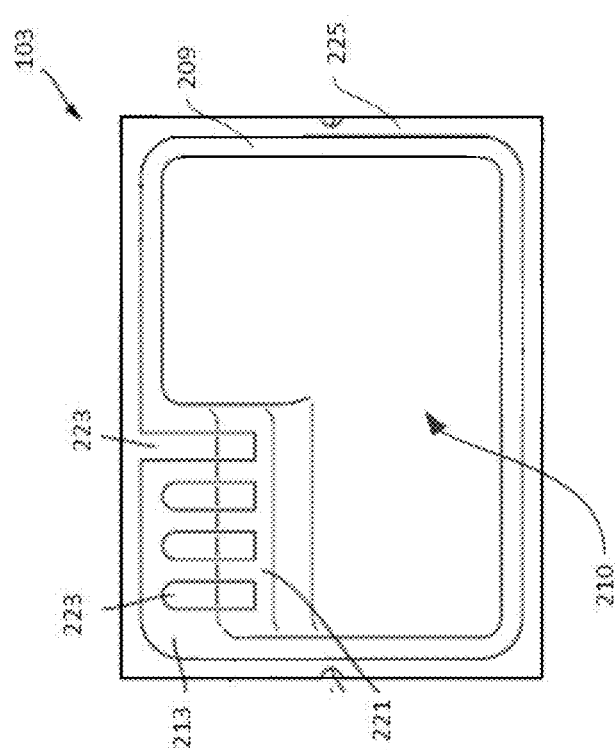
FIG. 5 is a top view of the package spacer of FIG. 2.

FIG. 4 illustrates a bottom view (i.e., from the substrate side) of the package spacer 103. This view illustrates that the bottom surface 209 of the package spacer 103 extends around the perimeter of the package spacer 103. The seal ring 225 may be formed as a metalization layer (i.e., a metal deposit) on top of the bottom surface 209 of the package spacer 103. The seal ring 225 provides a physical and electrical connection point with the substrate 105. For example, the seal ring 225 may be attached to the substrate 105 with solder. Alternatively, the bottom surface 209 of the package spacer 103 may be attached to the package spacer 103 with epoxy. In yet another embodiment, the bottom surface 209 of the package spacer 103 may be attached to the package spacer 103 with microbumps or solder microbumps under optional bump metallurgy pads (UBM). FIG. 5 illustrates an opposite view of FIG. 4 with the top surface 207 illustrated. As previously described, the top surface 207 provides a surface for physical and electrical connection with the conductive lid 107.

Figure 6:
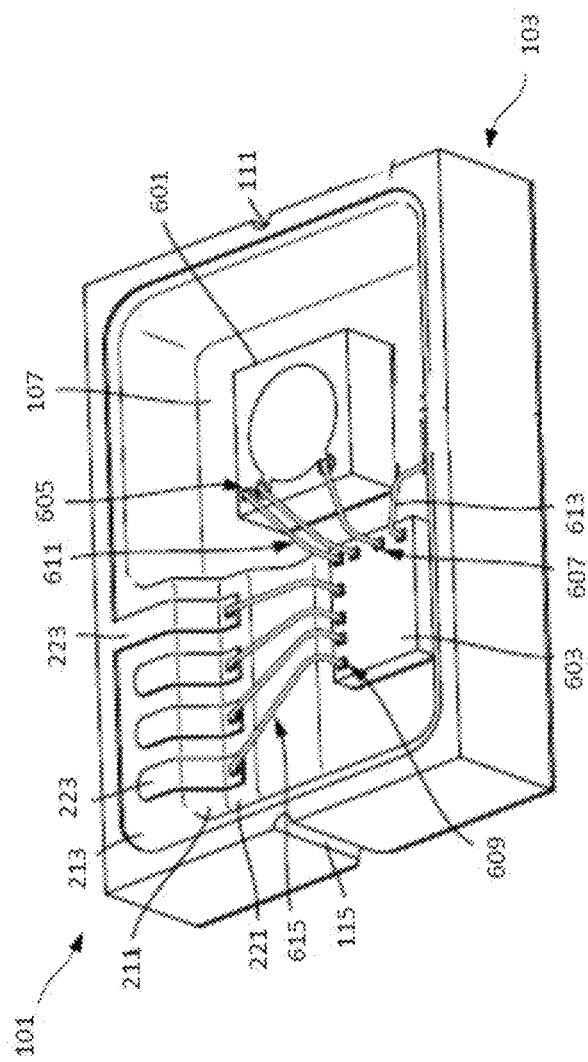
FIG. 6 is a perspective view of the MEMS microphone package of FIG. 1 prior to attachment of a substrate to the package spacer.

FIG. 6 illustrates the MEMS microphone package 101 without the substrate 105 to illustrate electronic components within the acoustic cavity. As such, FIG. 6 illustrates the internal configuration of the MEMS microphone package 101. The MEMS microphone package 101 includes a MEMS microphone die 601 and an application specific integrated circuit (ASIC) 603. Optionally, a second sensing die such as an inertial sensor, a chemical sensor, and the like may be mounted within the MEMS microphone package 101. Depending on the application, the ASIC 603 may not be included in the MEMS microphone package 101. The MEMS microphone die 601 and the ASIC 603 may be affixed or mounted directly to the conductive lid 107. The MEMS microphone die 601 includes bonding pads 605 configured to receive wired connections. Similarly, the ASIC 603 includes a first set of bonding pads 607 configured to receive wired connections from the MEMS microphone die 601 and a second set of bonding pads 609 configured to receive wired connections from the wire bonding surface 221. A first set of wires 611 are connected between the bonding pads 605 of the MEMS microphone die 601 and the first set of bonding pads 607 of the ASIC 603. A ground wire 613 connects the ASIC 603 to the conductive lid 107. A second set of wires 615 are connected between the second set of bonding pads 609 of the ASIC 603 and the conductive traces 223 on the wire bonding surface 221. In this way, a plurality of wires interconnect the interior electronic components and electrical traces within the MEMS microphone package 101.

When acoustic pressure enters into the MEMS microphone package 101 through the acoustic input port 109, the acoustic pressure impinges on a diaphragm (not shown) of the MEMS microphone die 601. The MEMS microphone die 601 senses the acoustic pressure via the diaphragm and generates an electrical signal based on the acoustic pressure. The ASIC 603 receives the electrical signal via the first set of wires 611 and generates another electrical signal representative of the acoustic pressure received by the MEMS microphone die 601. The ASIC 603 sends the electrical signal via the second set of wires 615 and the electrical traces 223 to the substrate 105 where the electrical signal is further processed and amplified.

FIG. 7 is a bottom view (i.e., from the substrate side) of the MEMS microphone package 101 illustrated in FIG. 6. As illustrated in FIG. 7, the ground wire 613 is connected to an arbitrary point 701 on the conductive lid 107. The MEMS microphone package 101 may also include an epoxy seal 703 to protect soldered electrical bonds at the connection point of the conductive traces 223 and the second set of wires 615 on the wire bonding surface 221.

Figure 9:
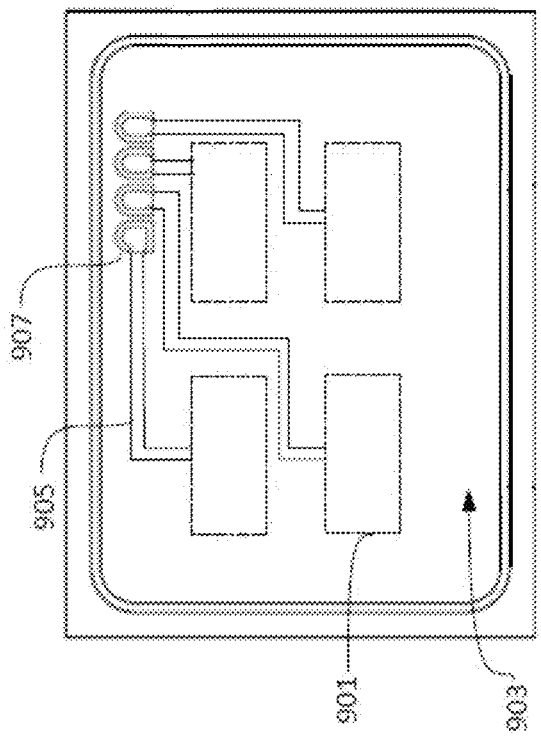
FIG. 9 is a top view of an interior side of the substrate of the MEMS microphone package of FIG. 1.
Figure 8:
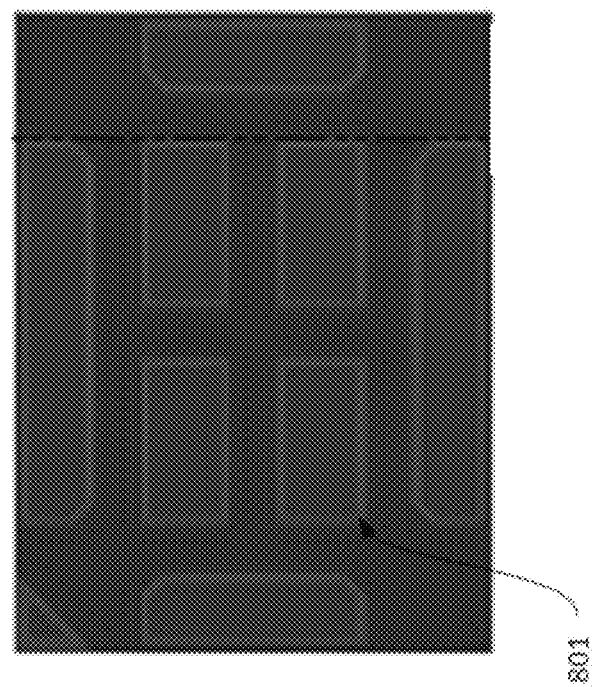
FIG. 8 is a bottom view of an external side of the substrate of the MEMS microphone package of FIG. 1.

FIG. 8 is a bottom view of the substrate 105. The substrate 105 may include electrical traces, electrical vias, and electrical components that provide connections to and support for the internal electrical components of the MEMS microphone package 101. For example, the substrate 105 may include external connection pads 801. The external connection pads 801 are connected to electrical vias (not shown) that form a conductive path through the substrate 105. As illustrated in FIG. 9, the electrical vias connect to substrate connection points 901 on an interior surface 903 of the substrate 105. The substrate connection points 901 are connected to substrate traces 905, which connect to package spacer connection pads 907. The package spacer connection pads 907 connect to the conductive traces 223 when the MEMS microphone package 101 is assembled. It should be noted that the substrate 105 may contain various types and configurations of electrical pathways and connections for the internal components of the MEMS microphone package 101.

Figure 10A:
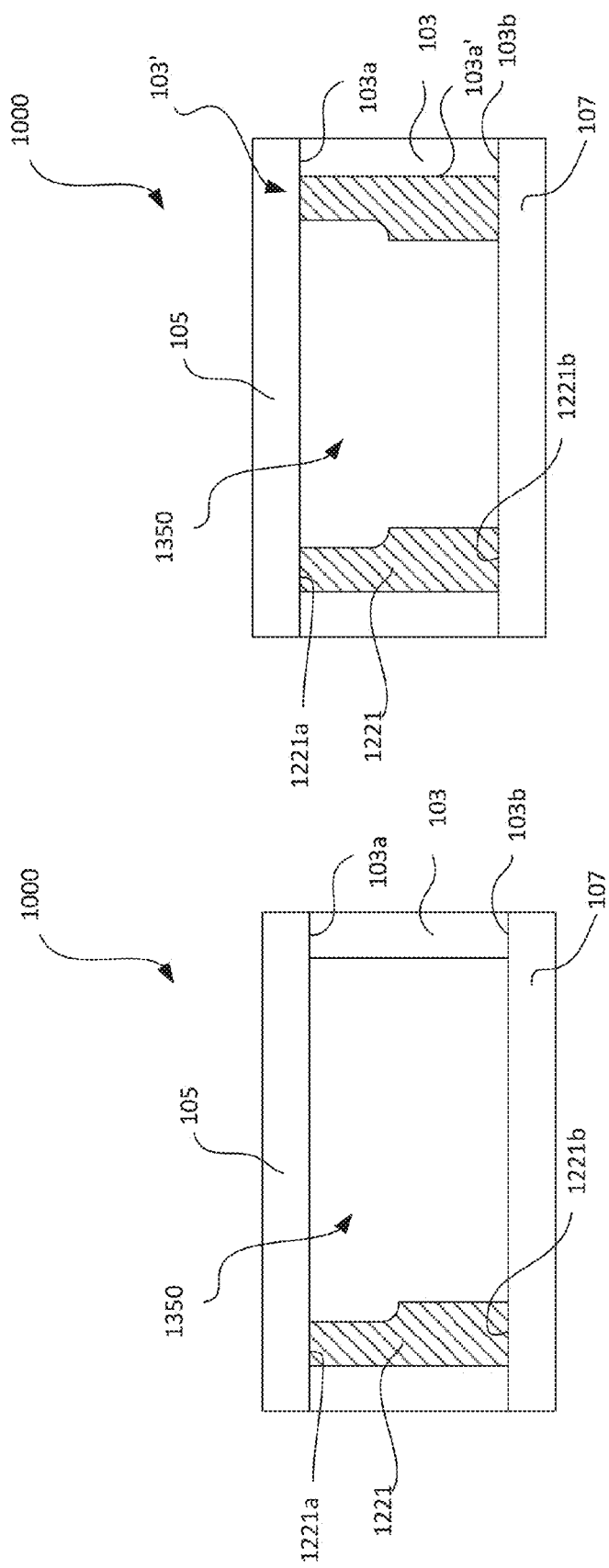
FIGS. 10A and 10A are cross-sectional views of another described embodiment of a MEMS device package.

FIGS. 10A and 10B depict cross-sectional views of a MEMS device package 1000 according to another described embodiment of the disclosure. The package 1000 is identical to the package 101 of FIG. 1 for encapsulating a microphone. Unlike from the package 101, the package 1000 is configured to encapsulate any internal electronics other than microphone. The internal electronics may be a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, an energy storage device, and any suitable components. More than one internal electronic may be disposed within the package 1000. Depending on the types of internal electronic, any number of optional ports may be formed on the package 1000 by etching, drilling, punching, or any suitable methods for receiving attributes from an environment which the package 1000 is exposed. The attributes may be acoustic signal, pressure signal, optical signal, gas signal, and any suitable signal. Like the package 101 of FIG. 1, the package 1000 includes a bonding shelf 1221. The bonding shelf 1221 may form part of an interior surface 1350 of the package 1000. As illustrated in FIG. 10A, the bonding shelf 1221 is formed separately and fixed to a portion of an inner wall 205 of a package spacer 103. A first surface 1221a of the bonding shelf 1221 may contact with a substrate 105 of the package 1000 and a second surface 1221b of the bonding shelf 1221 may contact with a lid 107 of the package 1000 when both the substrate 105 and the lid 107 are fixed to top and bottom surfaces 103a, 103b of the package spacer 103. More than one bonding shelf 1221, as separate structures, may form part of the interior surface 1350 of the package 1000. In some embodiments, a second or inner package spacer 103' is fixed to the inner wall 205 of a first or outer package spacer 103. As illustrated in FIG. 10B, an outer body 103a' of the second package spacer 103' conformed to the shape of package spacer 103. The second package spacer 103' includes a bonding shelf 1221 molded together with the second package spacer 103' during manufacturing. A first surface 1221a of the bonding shelf 1221 may contact with the substrate 105 of the package 1000 and a second surface 1221b of the bonding shelf 1221 may contact with a lid 107 of the package 1000 when both the substrate 105 and the lid 107 are fixed to both the first and second package spacers 103, 103'.

Figure 11C:
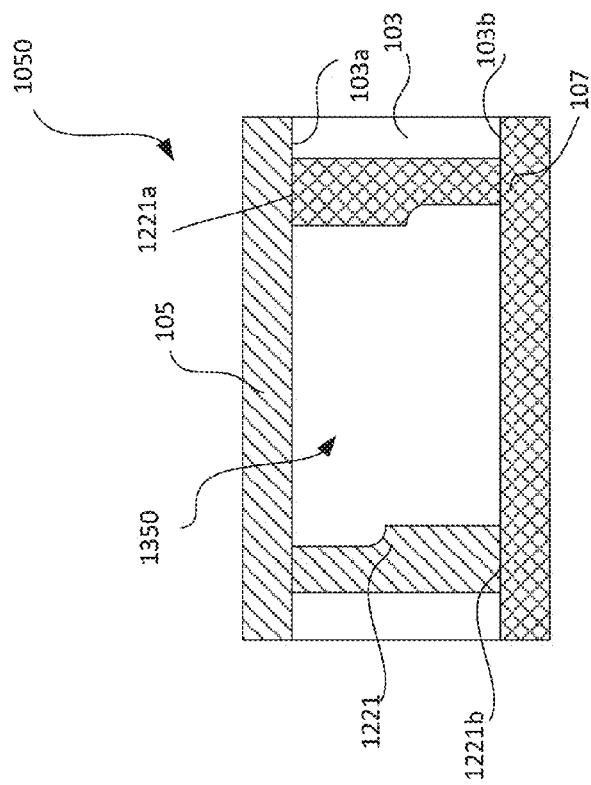

FIGS. 11A-11D depict cross-sectional views of a MEMS device package 1050 according to another described embodiment of the disclosure. The package 1050 is identical to the package 1000 of FIG. 10A, except the bonding shelf 1221 is molded together with at least one of the substrate 105 (as depicted in FIG. 11A) or the lid 107 (as depicted in FIG. 11C) during manufacturing. As illustrated in FIG. 11A, the substrate 105 includes first and second surfaces 105a, 105b with the bonding shelf 1221 extending perpendicular to surface 105b of the substrate along one edge. A surface 1221b of the bonding shelf 1221 may contact with the lid 107 of the package 1050 when the outer edge of the surface 105b of the substrate 105 and the lid 107 are fixed to top and bottom surfaces 103a, 103b the package spacer 103. More than one bonding shelf 1221, as separate structures, may form part of the interior surface 1350 of the package 1050. In some embodiments, a second package spacer 103' is fixed to the inner wall 205 of a first package spacer 103. As illustrated in FIG. 11B, an outer body 103a' of the second or inner package spacer 103' conformed to the shape of first or outer package spacer 103. The second package spacer 103' includes a bonding shelf 1221 molded together with the second package spacer 103' during manufacturing. A first surface 1221a of the bonding shelf 1221 may contact with the substrate 105 of the package 1050 and a second surface 1221b of the bonding shelf 1221 may contact with a lid 107 of the package 1050 when both the substrate 105 and the lid 107 are fixed to both the first and second package spacers 103, 103'. The package 1050 of FIG. 11C is similar in construction to the package 1050 of FIG. 11A, except, the bonding shelf 1221 is molded together with the lid 107 during manufacturing. The bonding shelf 1221 extends perpendicular to the lid 107 along one edge. A surface 1221a of the bonding shelf 1221 may contact with the substrate 105 of the package 1050 when the substrate 105 and the outer edge of the lid 107 are fixed to top and bottom surfaces 103a, 103b the package spacer 103.

Figure 11D:
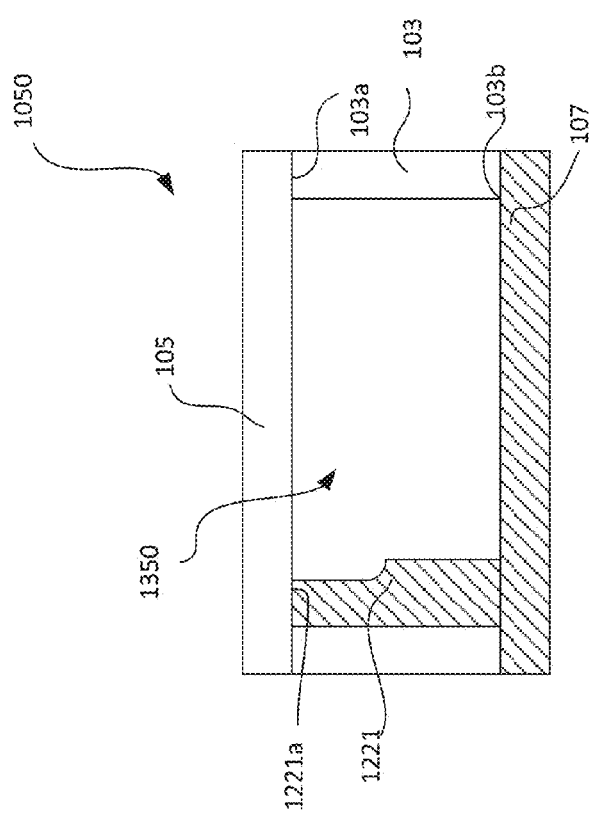

Now referring to FIG. 11D, first bonding shelf 1221 is molded together with the substrate 105 and second bonding shelf 1221' is molded together with the lid 107 are introduced. The substrate 105 with the first bonding shelf 1221 extends perpendicular to the substrate 105 along one edge. Similar to the construction of the substrate 105, the lid 107 with the second bonding shelf 1221' extends perpendicular to the lid 107 along one edge. The surface 1221b of the first bonding shelf 1221 may contact with the lid 107 and a surface 1221a' of the second bonding shelf 1221' may contact with the substrate 105 when the outer edge of the substrate 105 and the outer edge of the lid 107 are fixed to top and bottom surfaces 103a, 103b of the package spacer 103. Depending on the types of internal electronic, any number of optional ports may be formed on the package 1050 illustrated in FIGS. 11A-11D by etching, drilling, punching, or any suitable methods for receiving attributes from an environment which the package 1000 is exposed.

Figure 12B:
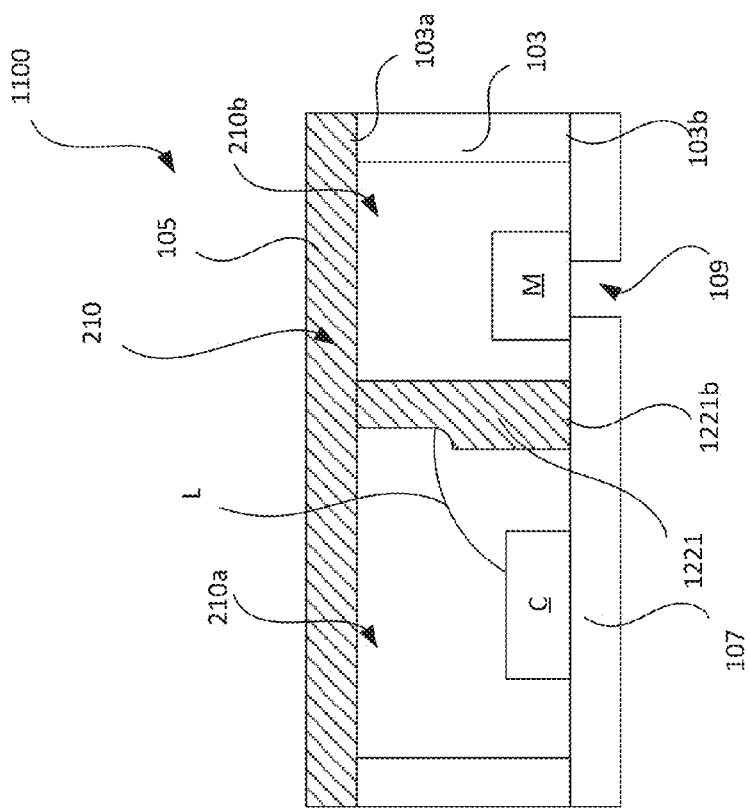
FIGS. 12A-12C are cross-sectional views of another described embodiment of a MEMS device package.
Figure 12A:
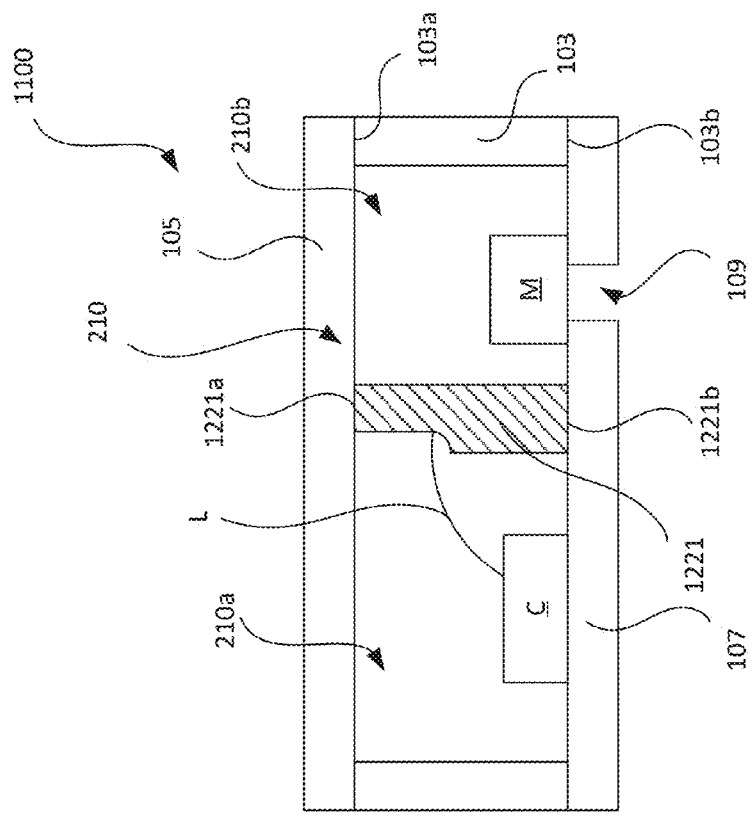
Figure 12C:
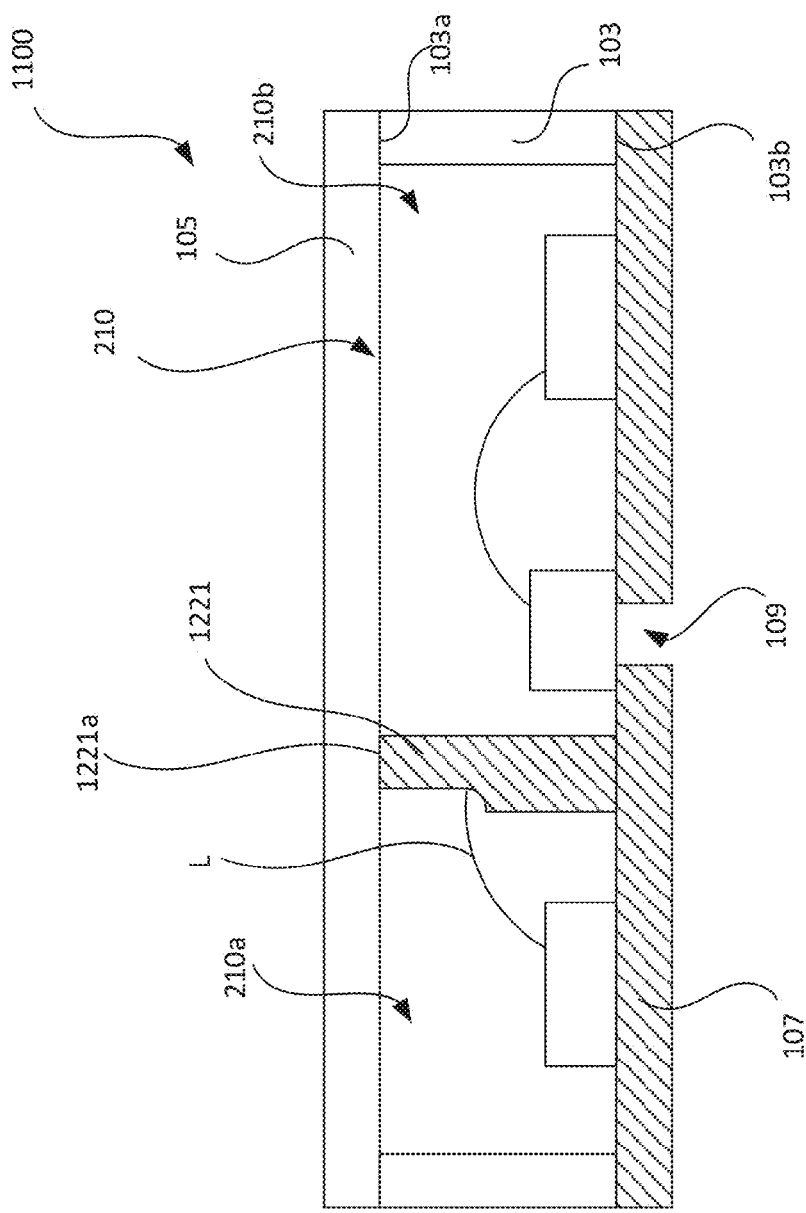

FIGS. 12A-12C depict cross-sectional views of a MEMS device package 1100 according to another described embodiment of the disclosure. The package 1100 is identical to the package 1000 of FIGS. 10A and 10B, except that the bonding shelf 1221 is positioned within the MEMS device package 1100 and divides the cavity 210 into first cavity 210a and second cavity 210b. Internal electronics may be a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, an energy storage device, and any suitable components may be mounted within the cavities 210a, 210b. Any number of ports 109 may be formed on the package 1100 by etching, drilling, punching, or any suitable methods via one of the substrate 105 or the lid 107 for receiving attributes from an environment which the package 1100 is exposed. The attributes may be acoustic signal, pressure signal, optical signal, gas signal, and any suitable signal. The internal electronics is located either above, adjacent to, below, proximal to, or at an angle offset to the port 109. As illustrated in FIG. 12A, a microphone M disposed within the cavity 210b is located above the port 109. For internal components C which require to be hermetically sealed, the components C may dispose within the cavity 210a are encapsulated by the package 103, the bonding shelf 1221, the substrate 105, and the lid 107. At least one link L is provided to electrically couple components C, M and provide electrical pathway between the components C, M within the package 1100 and any external devices or components. A first surface 1221a of the bonding shelf 1221 may contact with a substrate 105 of the package 1100 and a second surface 1221b of the bonding shelf 1221 may contact with the lid 107 of the package 1100 when both the substrate 105 and the lid 107 are fixed to top and bottom surfaces 103a, 103b of the package spacer 103.

As illustrated in FIGS. 12B and 12C, the bonding shelf 1221 is either molded together with the substrate 105 or the lid 107 during manufacturing to form a single structure. Referring to FIG. 12B, the substrate 105 with the bonding shelf 1221 extends perpendicular to the substrate along a location and adjacent to a center of the substrate. A surface 1221b of the bonding shelf 1221 may contact with the lid 107 of the package 1100 when the substrate 105 and the lid 107 are fixed to top and bottom surfaces 103a, 103b the package spacer 103. Now referring to FIG. 12C, the bonding shelf 1221 extends perpendicular to the lid 107 along a location and adjacent to a center of the lid is molded together with the lid 107 during manufacturing. A surface 1221a of the bonding shelf 1221 may contact with the substrate 105 of the package 1100 when the substrate 105 and the lid 107 are fixed to top and bottom surfaces 103a, 103b the package spacer 103.

Figures 13A, 13B:
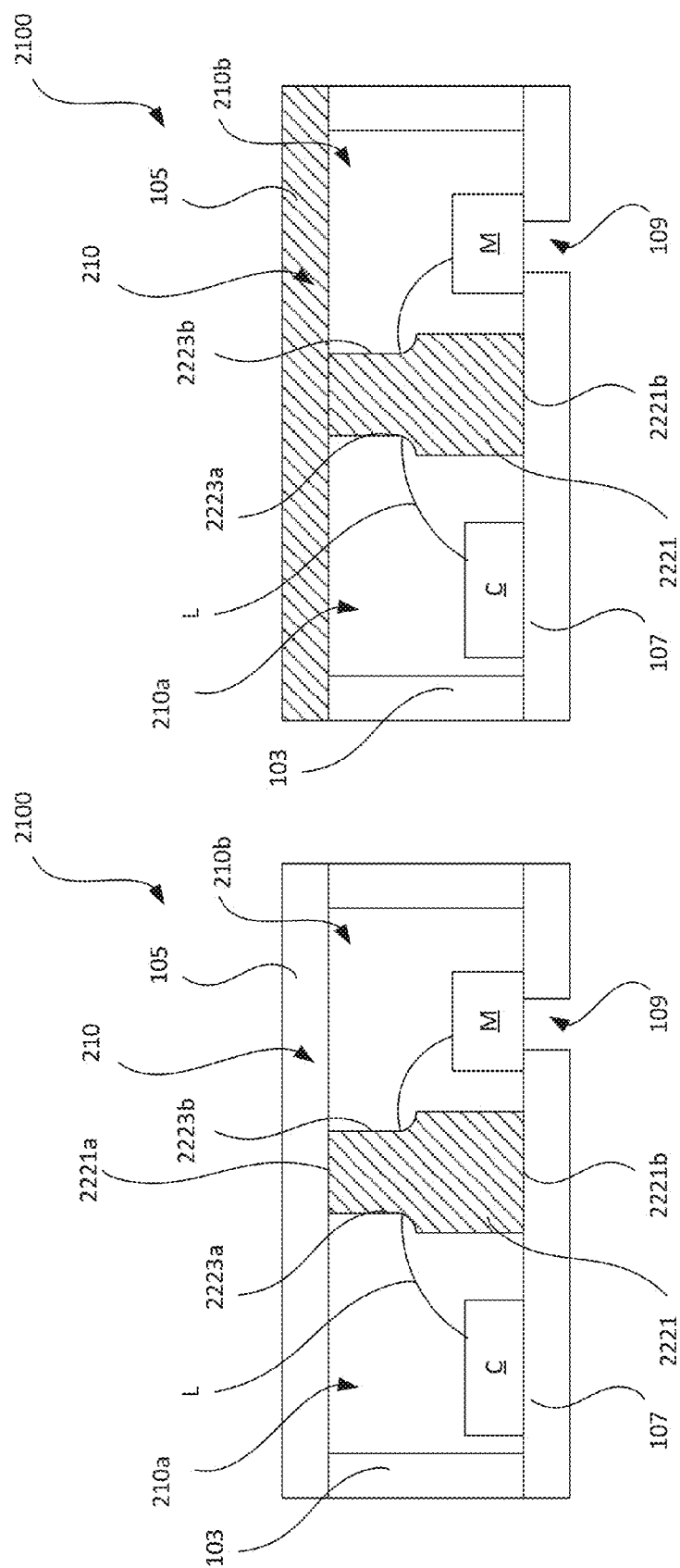
FIGS. 13A-13C are cross-sectional views of another described embodiment of a MEMS device package.
Figure 13C:
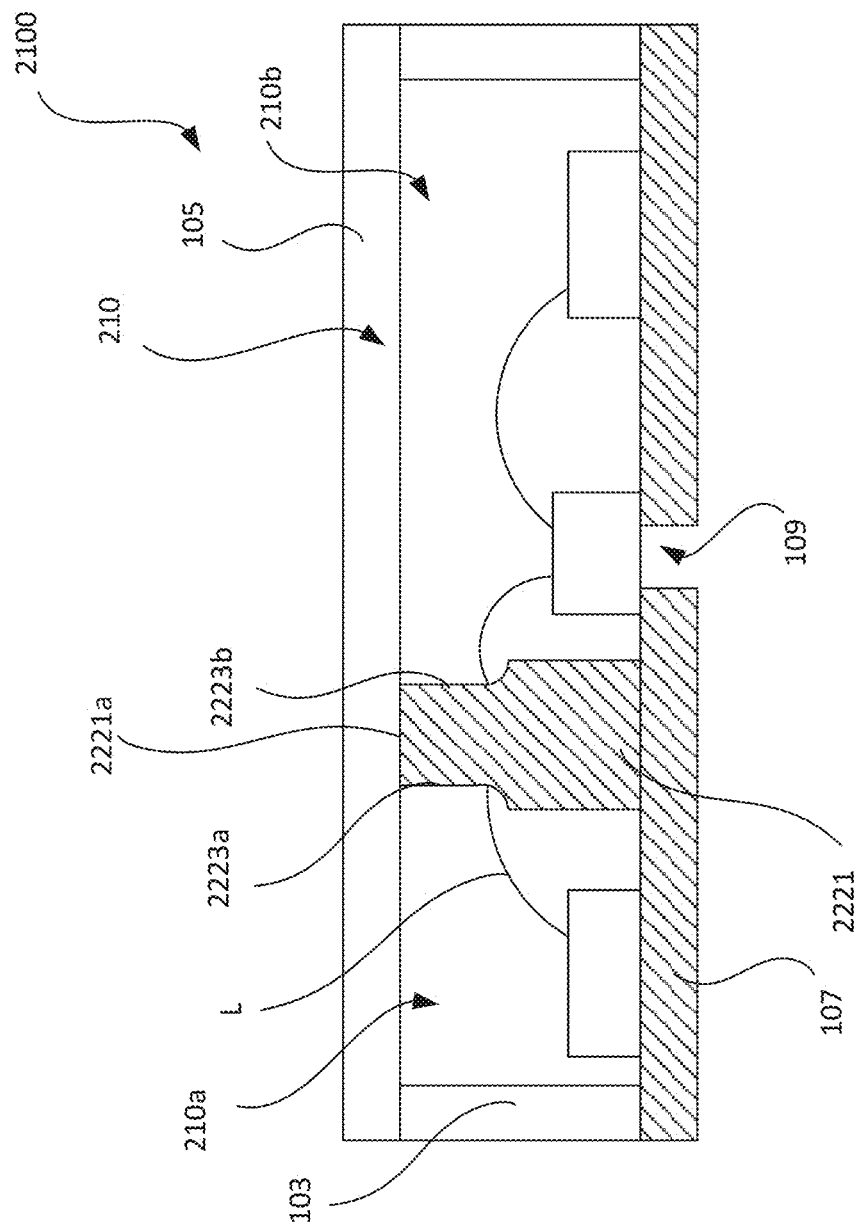

FIGS. 13A-13C depict cross-sectional views of a MEMS device package 2100 according to another described embodiment of the disclosure. The package 2100 is identical to the package 1100 of FIGS. 12A-12C, except that a dual bonding shelf assembly 2221 is positioned within the MEMS device package 2100 and divides the cavity 210 into first cavity 210a and second cavity 210b. Internal electronics may be a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, an energy storage device, and any suitable components may be mounted within the cavities 210a, 210b. The assembly 2221 includes first conductive trace 2223a faced toward components disposed within the cavity 210a and second conductive trace 2223b faced toward components disposed within the cavity 210b. Any number of ports 109 may be formed on the package 2100 by etching, drilling, punching, or any suitable methods via one of the substrate 105 or the lid 107 for receiving attributes from an environment which the package 2100 is exposed. The attributes may be acoustic signal, pressure signal, optical signal, gas signal, and any suitable signal. The internal electronics is located either above, adjacent to, below, proximal to, or at an angle offset to the port 109. As illustrated in FIG. 13A, a microphone M disposed within the cavity 210b is located above the port 109. For internal components C which require to be hermetically sealed, the components C may dispose within the cavity 210a are encapsulated by the package 103, the bonding shelf 1221, the substrate 105, and the lid 107. A first surface 2221a of the dual bonding shelf assembly 2221 may contact with a substrate 105 of the package 2100 and a second surface 2221b of the dual bonding shelf assembly 2221 may contact with the lid 107 of the package 2100 when both the substrate 105 and the lid 107 are fixed to top and bottom surfaces 103a, 103b of the package spacer 103. The assembly 2221 includes first conductive trace 2223a faced toward the components C and second conductive trace 2223b faced toward the microphone M. At least one link L is provided to electrically couple components C, M and provide electrical pathway between the components C, M within the package 2100 and any external devices or components.

As illustrated in FIGS. 13B and 13C, the dual bonding shelf assembly 2221 is either molded together with the substrate 105 or the lid 107 during manufacturing to form a single structure. Referring to FIG. 13B, the substrate 105 with the dual bonding shelf assembly 2221 extends perpendicular to the substrate along a location and adjacent to a center of the substrate. A surface 2221b of the dual bonding shelf assembly 2221 may contact with the lid 107 of the package 2100 when the substrate 105 and the lid 107 are fixed to top and bottom surfaces 103a, 103b the package spacer 103. Now referring to FIG. 13C, the dual bonding shelf assembly 2221 extends perpendicular to the lid 107 along a location and adjacent to a center of the lid is molded together with the lid 107 during manufacturing. A surface 2221a of the dual bonding shelf assembly 2221 may contact with the substrate 105 of the package 2100 when the substrate 105 and the lid 107 are fixed to top and bottom surfaces 103a, 103b the package spacer 103.

Figure 14B:
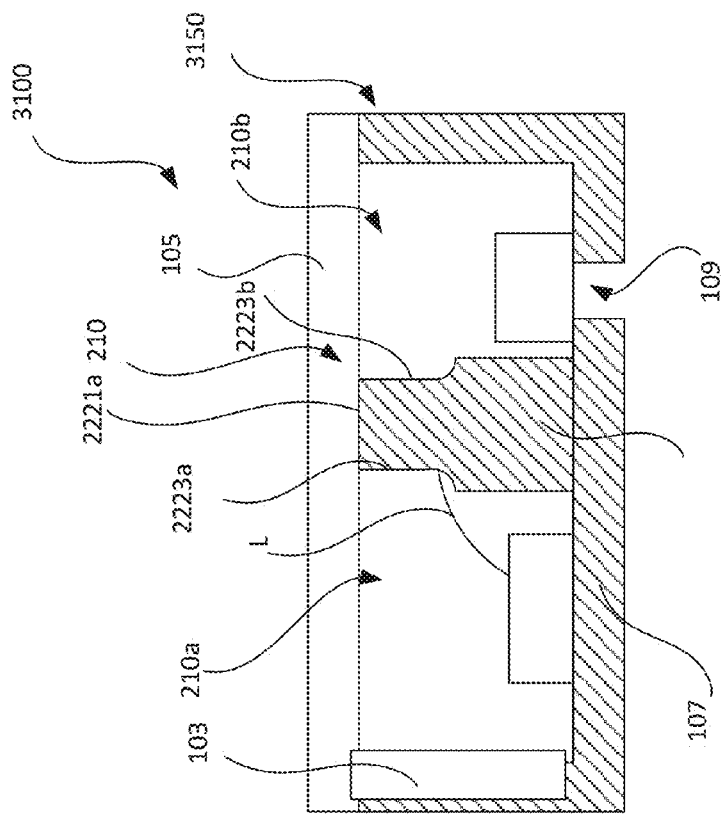
FIGS. 14A and 14B are cross-sectional views of another described embodiment of a MEMS device package.
Figure 14A:
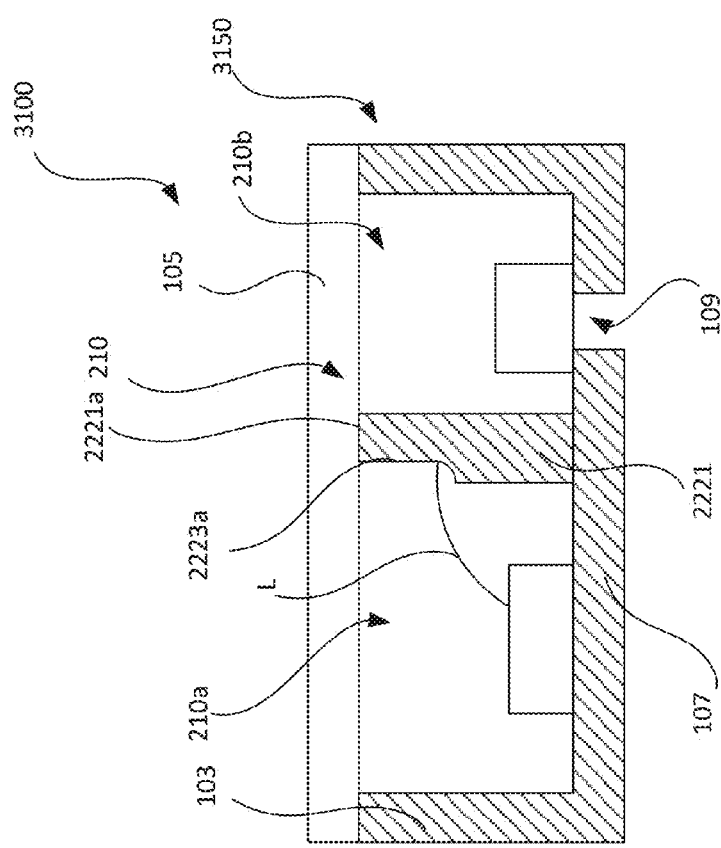

FIGS. 14A and 14B depict cross-sectional views of a MEMS device package 3100 according to another described embodiment of the disclosure. Unlike from the packages 1100, 2100 as depicted in FIGS. 12A-12C and 13A-13C, the package 3100 includes a molded interconnect cover 3150 that is coupled to the substrate 105 by any known techniques. The molded interconnect cover 3150 includes a lid 107, a spacer 103, and a bonding shelf assembly 221. In the illustrated embodiment, the lid 107, the spacer 103, and the bonding shelf assembly 221 are molded together during manufacturing. The bonding shelf assembly 221 extended perpendicular to the lid 107 along a location divides the cavity 210 formed within the package 3100 into first cavity 210a and second cavity 210b. Any number of internal components may be disposed within the first and second cavities 210a, 210b. The internal electronics may be a MEMS transducer, a semiconductor device, a speaker, a receiver, a microphone, a pressure sensor, a thermal sensor, an optical sensor, an imaging sensor, a chemical sensor, a gyroscope, an accelerometer, a gas sensor, an environmental sensor, a motion sensor, a navigation sensor, an integrated circuit, an ASIC, a processor, a controller, an energy storage device, and any suitable components. The assembly 221 includes at least one conductive trace 223a, as shown in FIG. 14A, electrically coupled the components within the package 3100 with any devices or components outside the package 3100. In some embodiments, more than one conductive trace, two traces 223a, 223b are illustrated in FIG. 14B, are formed on the bonding shelf 221 of the molded interconnect cover 3150 to electrically couple the components within the package 3100 with any devices or components located outside the package 3100. Any number of ports 109 may be formed on the molded interconnect cover 3150 by etching, drilling, punching, or any suitable methods for receiving attributes from an environment which the package 3100 is exposed. The attributes may be acoustic signal, pressure signal, optical signal, gas signal, and any suitable signal. The internal electronics may locate either above, adjacent to, below, proximal to, or at an angle offset to the port 109.

Figure 15:
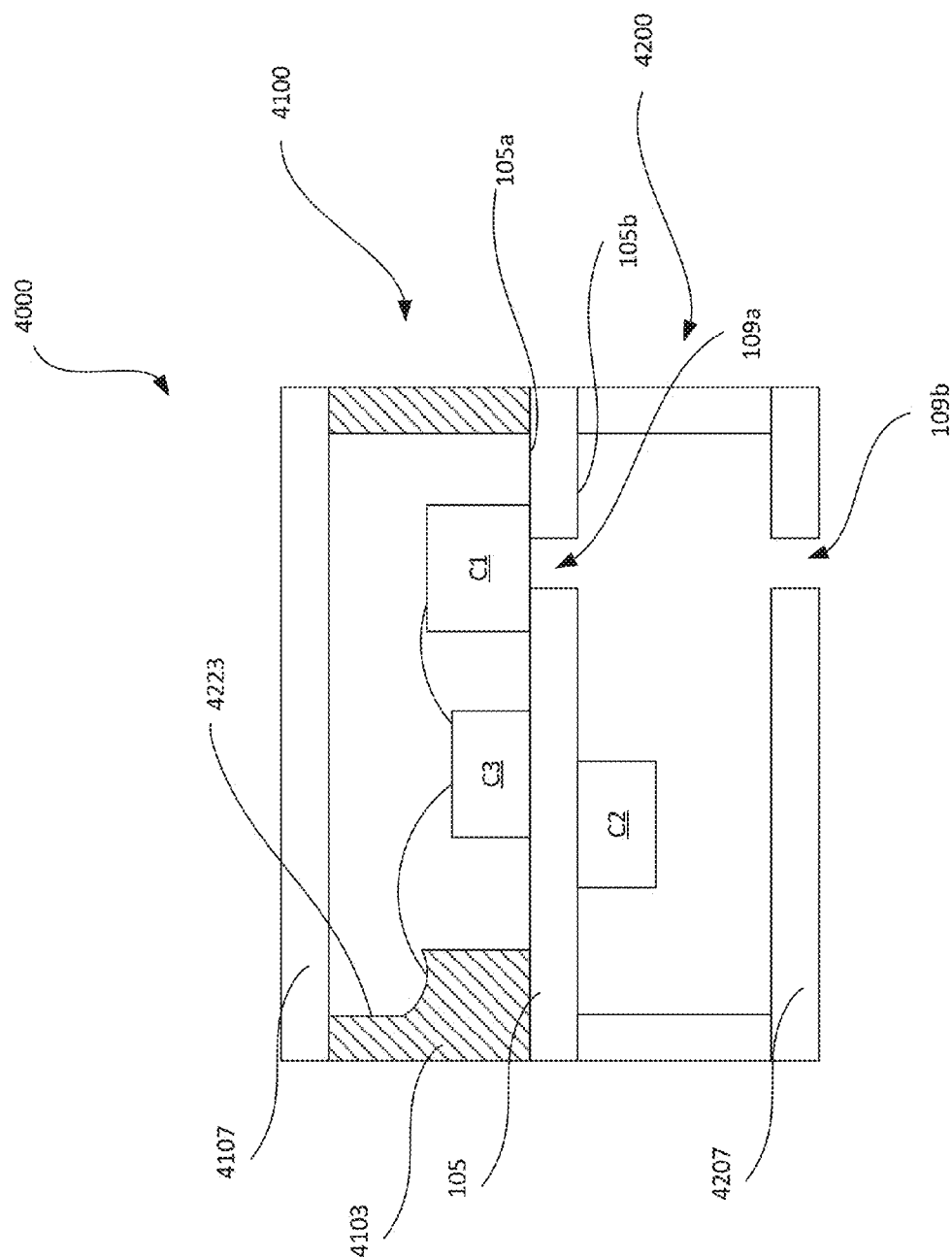
FIG. 15 is a cross-sectional view of an exemplary embodiment of a combo MEMS device package assembly.

FIG. 15 illustrates an exemplary embodiment of a combo MEMS device package assembly 4000 of the disclosure. The assembly 4000 includes a first MEMS device package 4100 and a second MEMS device package 4200 mounted to together in a back-to-back configuration. As can be seen, the packages 4100, 4200 share a common substrate 105 having a first and second surfaces 105a, 105b. Any number of internal components mounted to the surfaces 105a, 105b of the substrate 105 are encapsulated by the packages 4100, 4200. A first port 109a is formed on the substrate 105 and a second port 109b is formed on a lid 4207 of the second MEMS device package 4200 for receiving attributes from an environment which the assembly 4000 is exposed. The attributes may be acoustic signal, pressure signal, optical signal, gas signal, and any suitable signal. The internal electronics may locate either above, adjacent to, below, proximal to, or at an angle offset to the ports 109a, 109b. In the illustrated embodiment, component C1 disposed within the package 4100 is located on top of the port 109a and components C2 disposed within the package 4200 is located adjacent to the ports 109a, 109b. The first package 4100 further includes a lid 4107 and a spacer 4103 fixedly attached to the lid 4107 and the common substrate 105. The spacer 4103 includes a bonding shelf 4211. The bonding shelf 4211 may form part an inner wall 4205 of the spacer 4103. In some embodiments, the bonding shelf 4211 may be molded together with the spacer 4103 during manufacturing. Conductive traces 4223 is formed by depositing a conductive material, such as a metal film, onto the bonding shelf 4211. The conductive traces 4223 provide electrical pathways between the components disposed within the assembly 4100 and devices or components located outside the assembly 4100.

Figure 16:
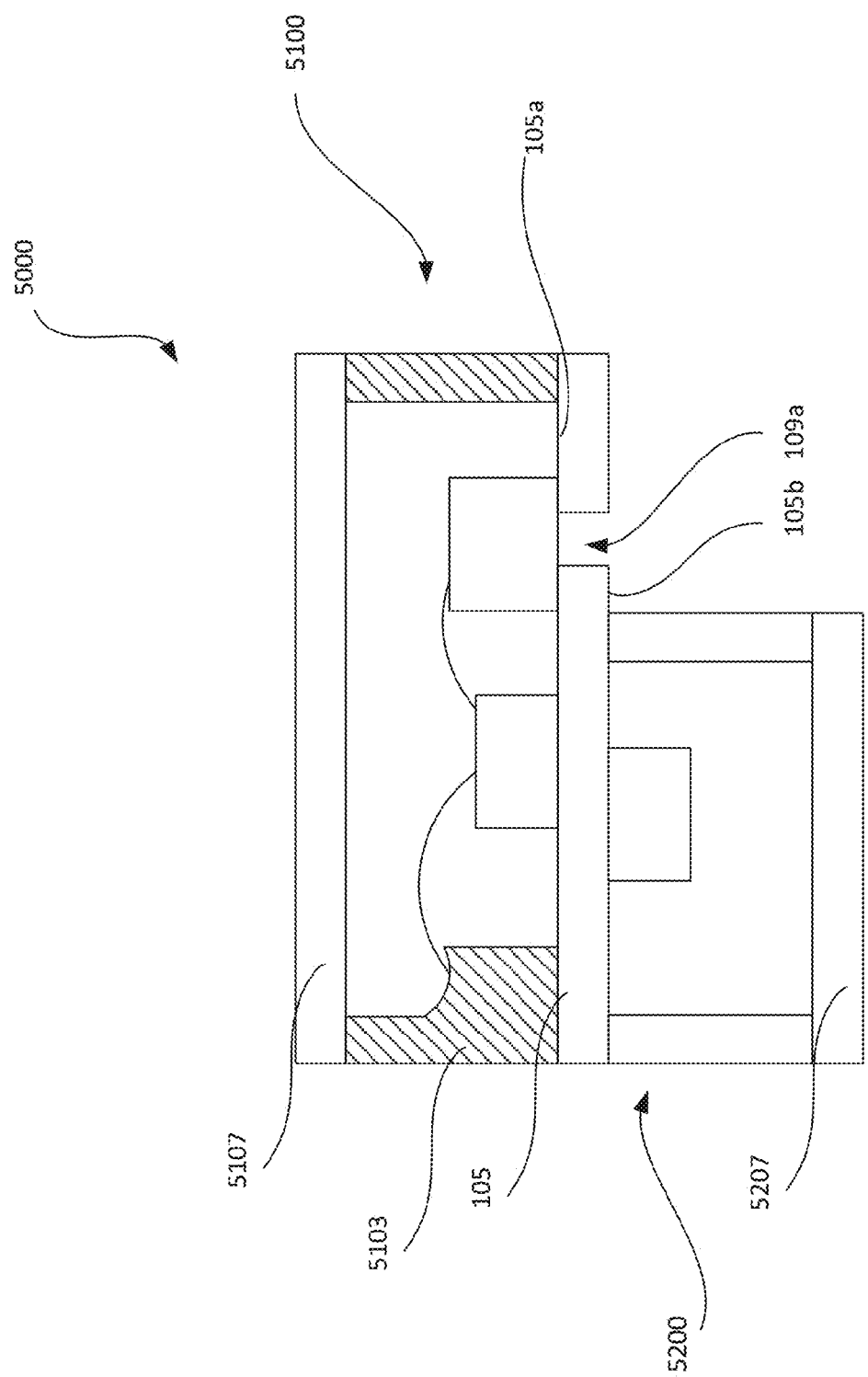
FIG. 16 is a cross-sectional view of another described embodiment of a combo MEMS device package assembly.

FIG. 16 illustrates an exemplary embodiment of a combo MEMS device package assembly 5000 of the disclosure. Unlike from the assembly 4000 as illustrated in FIG. 15, the port 109a formed on a first MEMS device package 5100 is not covered by a second MEMS device package 5200 leaving the port 109a exposed to the external environment. The internal component disposed within the second MEMS device package 5200 is hermetically sealed from the external environment.

Thus, the disclosure provides, among other things, a microelectromechanical system (MEMS) device package including a conductive lid and a molded spacer adapted to connect the conductive lid to a substrate. Various features and advantages of the disclosure are set forth in the following claims.

What is claimed is:

1. A microelectromechanical system (MEMS) device package comprising:
    a spacer having a top surface, a bottom surface, and a cavity formed between the top and bottom surfaces;
    a bonding shelf assembly having a bonding shelf positioned in the cavity;
    a substrate connected to the bottom surface of the spacer; and
    a lid connected to the top surface of the spacer;
    wherein the bonding shelf is molded with at least one of the substrate or the lid to form a single monolithic component of the MEMS device package.

2. The MEMS device package of claim 1 further comprising at least one MEMS device mounted on at least one of the substrate or the lid, the MEMS device electrically connected to the bonding shelf.

3. The MEMS device package of claim 1 wherein the bonding shelf extends perpendicular to one of an upper horizontal surface of the substrate or a lower horizontal surface of the lid.

4. The MEMS device package of claim 2 wherein the bonding shelf divides the cavity into a first cavity and a second cavity.

5. The MEMS device package of claim 4, wherein at least one MEMS device is disposed within the first cavity and a second MEMS device is disposed within the second cavity.

6. The MEMS device package of claim 5, further comprising a port formed on at least one of the substrate or the lid, the port is fluidly communicated with one of the first or second cavity.

7. The MEMS device package of claim 6, wherein the MEMS device is disposed in the first cavity, and the port is fluidly communicated with the MEMS device via the first cavity.

8. The MEMS device package of claim 7, further comprising a second MEMS device package coupled to at one of the substrate or the lid.

9. The MEMS device package of claim 8, wherein the second MEMS device package is located either above, below, or adjacent to the port.

10. A microelectromechanical system (MEMS) device package comprising:
    a substrate;
    a lid;
    an outer spacer positioned between the substrate and the lid and having a top surface, a bottom surface, and a cavity formed between the top and bottom surfaces; and
    an inner spacer having a bonding shelf assembly positioned in the cavity;
    wherein the bonding shelf assembly is molded with the inner spacer to form a single monolithic component of the MEMS device package.

11. The MEMS device package of claim 10 wherein at least one MEMS device is disposed within the cavity, and the MEMS device is electrically connected to one of the substrate or the lid via the bonding shelf assembly.

12. A combo microelectromechanical system (MEMS) device package assembly comprising:
    a first MEMS device package having a cover;
    a second MEMS device package having a cover;
    a common substrate having a first surface and a second surface; and
    a bonding shelf assembly having a conductive surface;
    wherein the cover of the first MEMS device package is electrically coupled to the first surface of the common substrate and the cover of the second MEMS device package is electrically coupled to the second surface of the common substrate, the bonding shelf assembly is formed as a portion of at least one of the cover of the first or second MEMS device package.

13. The combo MEMS device package assembly of claim 12 wherein a port is formed on the first MEMS device package.

14. The combo MEMS device package assembly of claim 13 wherein the second MEMS device package is located either above, below, or adjacent to the port of the first MEMS device package.

15. The combo MEMS device package assembly of claim 14 wherein a port is formed on the second MEMS device package.

16. The combo MEMS device package assembly of claim 15 wherein the port of the first MEMS device package fluidly communicated with an environment via the port formed on the second MEMS device package.

17. The combo MEMS device package assembly of claim 15 wherein the port of the first MEMS device package fluidly communicated with an environment.

18. The combo MEMS device package assembly of claim 12 wherein the second surface is located opposite the first surface.

* * * * *

UNITED STATES PATENT AND TRADEMARK OFFICE
CERTIFICATE OF CORRECTION

PATENT NO. : 9,781,519 B2  
APPLICATION NO. : 15/099096  
DATED : October 3, 2017  
INVENTOR(S) : Kuldeep Saxena Page 1 of 1

It is certified that error appears in the above-identified patent and that said Letters Patent is hereby corrected as shown below:

On the Title Page

Item (54) and in the Specification, Column 1 Line 1-3, the title of the invention should read:
MOLDED INTERCONNECT MICROELECTROMECHANICAL SYSTEM (MEMS) DEVICE PACKAGE Signed and Sealed this  
Sixth Day of November, 2018

Andrei Iancu  
*Director of the United States Patent and Trademark Office*